United States Patent [19]
Reis

[11] Patent Number: 5,524,908
[45] Date of Patent: Jun. 11, 1996

[54] MULTI-LAYER EMI/RFI GASKET SHIELD

[75] Inventor: Bradley E. Reis, Wilmington, Del.

[73] Assignee: W. L. Gore & Associates, Newark, Del.

[21] Appl. No.: 306,505

[22] Filed: Sep. 14, 1994

[51] Int. Cl.⁶ .................................................... F16J 15/12
[52] U.S. Cl. ........................ 277/233; 277/234; 277/901; 174/35 GC
[58] Field of Search .................................. 277/227, 233, 277/234, 901, DIG. 6; 174/35 GC

[56] References Cited

U.S. PATENT DOCUMENTS

| | | | |
|---|---|---|---|
| 2,317,813 | 4/1943 | Schoenborn | 174/35 GC |
| 2,477,267 | 7/1949 | Robinson | 174/35 GC |
| 2,532,011 | 11/1950 | Dahlquist et al. | |
| 2,796,457 | 6/1957 | Stinger | 277/901 |
| 3,555,168 | 1/1971 | Frykberg | 174/35 GC |
| 3,783,173 | 1/1974 | Twomey | 174/35 GC |
| 3,962,153 | 6/1976 | Gore | |
| 4,054,714 | 10/1977 | Mastrangelo | |
| 4,096,227 | 6/1978 | Gore | |
| 4,157,410 | 6/1979 | McClintock | |
| 4,161,557 | 7/1979 | Suzuki et al. | |
| 4,187,390 | 2/1980 | Gore | |
| 4,223,897 | 9/1980 | Staab et al. | |
| 4,514,585 | 4/1985 | Paynton | 174/35 GC |
| 4,635,948 | 1/1987 | Zerfass et al. | |
| 4,662,967 | 5/1987 | Bogan et al. | |
| 4,720,400 | 1/1988 | Manniso | |
| 4,764,422 | 8/1988 | Hill et al. | |
| 4,823,229 | 4/1989 | Waterland, III | 174/35 GC |
| 4,968,550 | 11/1990 | Socha | |
| 4,968,854 | 11/1990 | Benn, Sr. et al. | |
| 4,988,550 | 1/1991 | Keyser et al. | |
| 5,068,493 | 11/1991 | Benn, Sr. et al. | |
| 5,070,216 | 12/1991 | Thornton | |
| 5,107,070 | 4/1992 | Benn, Sr. et al. | |
| 5,126,185 | 6/1992 | Forrest et al. | |
| 5,141,770 | 8/1992 | Benn, Sr. et al. | |
| 5,250,342 | 10/1993 | Lang et al. | |
| 5,348,311 | 9/1994 | Miyaoh et al. | 277/9 |

FOREIGN PATENT DOCUMENTS

| | | | |
|---|---|---|---|
| 0454311 | 4/1991 | European Pat. Off. | |
| 1117124 | 5/1956 | France | 277/901 |
| 1002996 | 2/1957 | Germany | 277/233 |
| 2536939 | 10/1976 | Germany | |
| 2828475 | 1/1980 | Germany | |
| 3108400 | 5/1991 | Japan | |
| 365397 | 12/1992 | Japan | 174/35 GC |
| 8403645 | 3/1984 | WIPO | |
| 91/01619 | 2/1991 | WIPO | 174/35 GC |

Primary Examiner—Scott W. Cummings
Attorney, Agent, or Firm—David J. Johns

[57] ABSTRACT

An multi-layered EMI gasket has a first layer constructed of an electrically conductive resilient material and a second, support layer of an electrically conductive material secured in facing engagement with the first layer. The material of the second layer is more rigid than the material of the first layer, so that the second layer imparts rigidity to the gasket. Preferably, the resilient material is carbon particle filled EPTFE and the support layer is a metal foil. The combination of these elements is very effective at conducting electrical signals, thereby providing exceptional EMI/RFI shielding of electronic components, while being far easier to handle and install than prior art gaskets. Further, the resilient material of the first layer permits the gasket to conform to irregular surfaces, thus providing an excellent environmental seal.

24 Claims, 4 Drawing Sheets

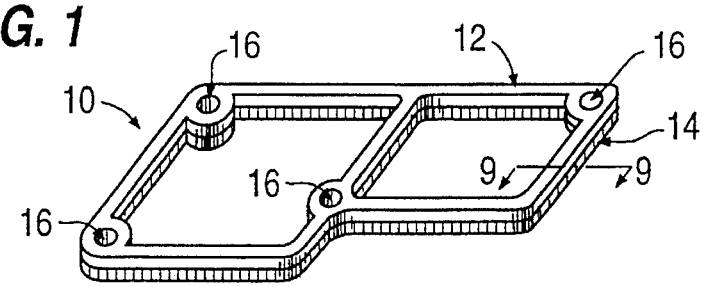
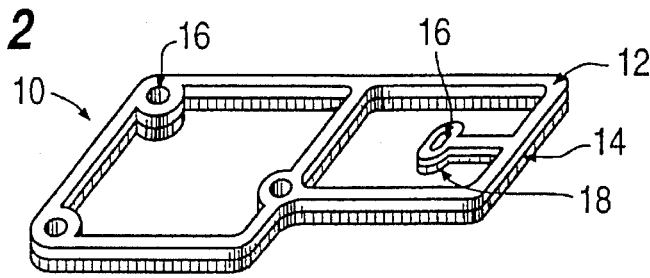
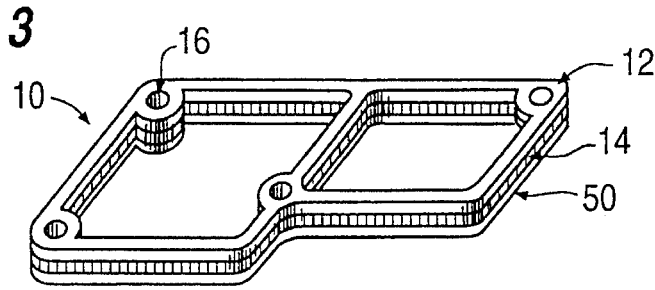
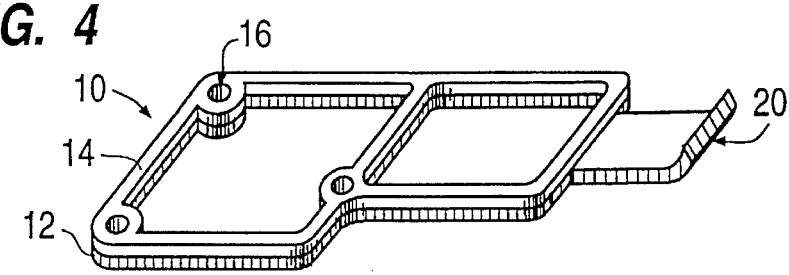
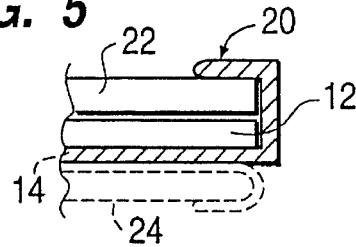
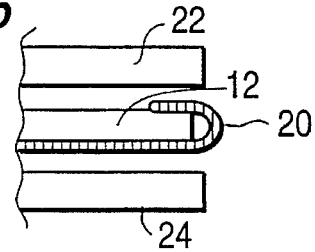

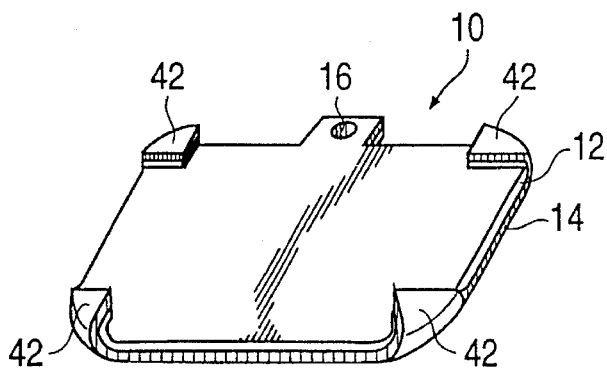
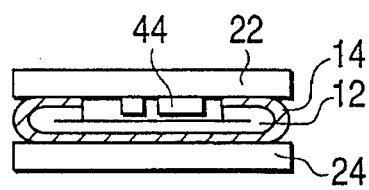
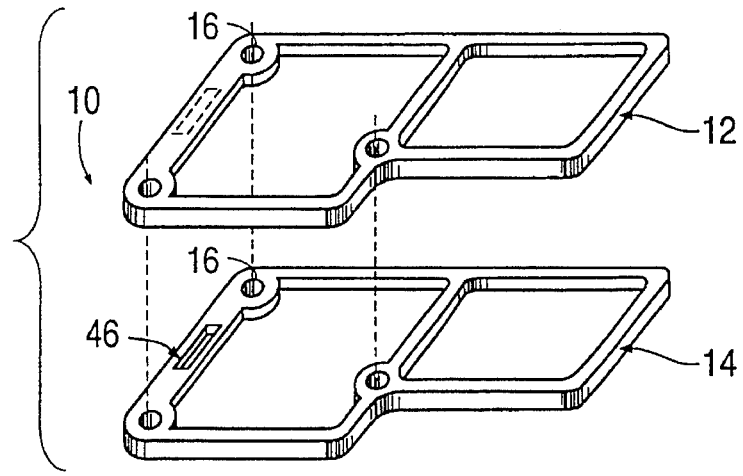
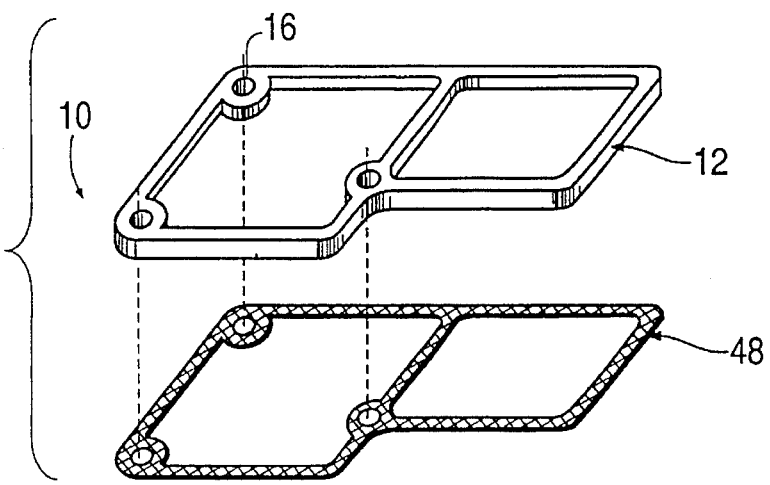

MULTI-LAYER EMI/RFI GASKET SHIELD

FIELD OF THE INVENTION

The present invention relates to gaskets, and more particularly, to a gasket for shielding electrical components from electromagnetic interference (EMI) and radio frequency interference (RFI).

BACKGROUND OF THE INVENTION

Commercial and military electronics products are often required to provide EMI and RFI (collectively referred to hereinafter as EMI) shielding around control and display devices. Additionally, electronic components mounted within systems, such as computer systems and signal processing systems must also be shielded from EMI in order to prevent adverse influence on the performance of electronic circuits within the systems. One means of controlling EMI is through the process of shielding, which seeks to confine radiated energy to the bounds of a specific volume or prevent radiated energy from reaching a specific volume. A means for suppressing EMI on printed circuit boards (PCBs) is to provide only one common ground, preferably enclosing or encircling the electronic components. This structure effectively creates a "Faraday Cage" to isolate electronic components on the PCB.

EMI gaskets are well known and are commonly used at the seams and joints of a system, around switches, displays, connectors and around electronic components or groups of components on PCBs. A gasket's shielding effectiveness depends on the material properties of the gasket. Good conductors should be used for electric field shields to obtain high reflection loss and magnetic materials should be used for magnetic field shields to obtain high absorption loss. Shield materials should also be selected for electrochemical corrosion, strength considerations, and conformability.

Many prior art shielding gaskets are formed of a compressible material loaded or wrapped with a conductive material or materials, or a conductive mesh to absorb or reflect EMI. However, these shields are often flimsy, making them difficult to work with and install. Accordingly, there is a need for an EMI gasket having enhanced tensile strength and stiffness properties, while retaining the ability to conform to and around irregular surfaces.

U.S. Pat. No. 5,070,216 to Thornton discloses an EMI shielding gasket for preventing discontinuities in electronic equipment between a cabinet frame and a cabinet door comprising a resilient plastic substrate having an attachment portion and a contact portion, and a metallic conductive coating on an outer surface of the plastic substrate for providing electrical continuity. This gasket has some weaknesses since microwave shielding is determined not only by the DC resistance, but by the degree of conformability of the conductive material, since any resultant gaps or slots will increase radiative emissions/susceptibility and thereby reduce the shielding effectiveness. Further, the gasket is not completely malleable or conformable. Thus, in order to conform to irregular or uneven surfaces, the gasket requires the use of finger like protrusions formed on the bearing portion of the material.

It would be desirable to provide an electrically conductive gasket capable of shielding components from EMI which is semi-rigid so that the gasket is easy to handle and install, yet is highly electrically conductive and provides improved conformability.

SUMMARY OF THE INVENTION

Briefly stated, the present invention is directed to a gasket that has very good EMI/RFI shielding properties combined with improved handling characteristics. The properties of the present invention are achieved by a unique combination of conductors in layered relation, the conductors having particular electrical conductivity and mechanical strength qualities.

In its basic form, the gasket of the present invention comprises a first electrically conductive layer formed of a somewhat resilient material and a second electrically conductive layer formed of a rigid material. The resilient material is preferably a carbon particle filled expanded polytetrafluoroethylene (EPTFE) and the rigid material layer is preferably a metal, such as, but not limited to copper, gold, silver, nickel, aluminum, or an alloy thereof. The metal layer imparts significant rigidity to the resilient material layer, thus allowing the gasket to maintain its shape when not supported. The combination of these elements is very effective at conducting electrical signals, thereby providing exceptional EMI/RFI shielding of electronic components, while being far easier to handle and install than prior art gaskets. Further, the resilient material of the first layer permits the gasket to conform to irregular surfaces, thus the gasket also provides an excellent environmental seal and high frequency seal because gaps are eliminated.

The present invention further provides a method of imparting rigidity to an electrically conductive gasket made of a resilient material, comprising the steps of providing an electrically conductive resilient material and adding a layer of electrically conductive metal or other rigid conductive material over a surface of the resilient material, the rigid conductive layer imparting rigidity to the resilient material, yet allowing the resilient material layer to maintain conformability. These properties produce a gasket that provides for a plethora of previously unavailable EMI/RFI gasket designs and applications.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings:

FIG. 1 is a perspective view of an EMI gasket in accordance with the present invention;

FIG. 2 is a perspective view of an EMI gasket in accordance with the present invention including a discontinuous leg;

FIG. 3 is a perspective view of a first alternate embodiment of an EMI gasket in accordance with the present invention;

FIG. 4 is a perspective view of an EMI gasket in accordance with the present invention including a tab;

FIG. 5 is an enlarged, partial front elevational view of the EMI gasket of FIG. 4 with the tab bent around an upper substrate with an alternative embodiment shown in phantom with the tab bent around a lower substrate;

FIG. 6 is an enlarged, exploded, partial front elevational view of the EMI gasket of FIG. 4 with the tab bent beneath an upper substrate;

FIG. 11 is a perspective view of an EMI gasket in accordance with the present invention including a plurality of folded tabs;

FIG. 12 is a partial front elevational view of the EMI gasket of FIG. 11 located between two substrates;

FIG. 13 is an exploded perspective view of an EMI gasket in accordance with the present invention having a hole in a section of the rigid material layer;

FIG. 14 is an exploded perspective view of an EMI gasket in accordance with the present invention having a conductive mesh layer;

DETAILED DESCRIPTION OF THE INVENTION

Figure 7A:
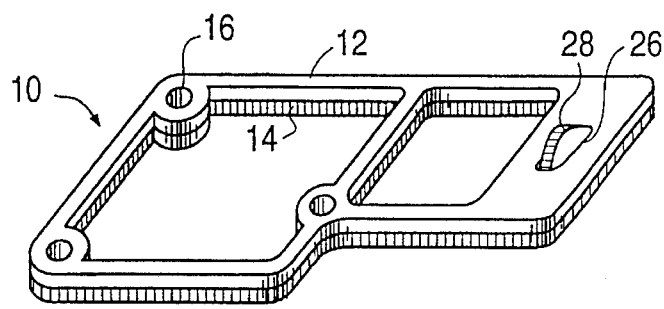
FIG. 7A is a perspective view of an EMI gasket in accordance with the present invention including a grounding finger.

Certain terminology is used in the following description for convenience only and is not limiting. The words "inwardly" and "outwardly" refer to directions towards and away from, respectively, the geometric center of the gasket and designated parts thereof. The words "upper" and "lower" refer to directions on opposing sides of the gasket and designated parts thereof. The terminology includes the words specifically mentioned, derivatives thereof and words of similar import.

Although EMI gaskets are known and have been used for many years, no known EMI gaskets have used the unique combination of materials employed in the present invention. The preferred embodiments of the present invention combine an electrically conductive carbon particle filled EPTFE resilient material layer and an electrically conductive material support layer secured in facing engagement to the resilient material layer, the support layer being about one-fifth the thickness of the resilient material layer and imparting limited stiffness to the resilient material layer. This combination has been found to yield surprisingly good results for providing a relatively stiff, yet malleable and conformable gasket for EMI/RFI shielding and environmental sealing.

Referring now to the drawings in detail, wherein like numerals indicate like elements throughout, there is shown in FIG. 1 a presently preferred embodiment of a gasket, indicated generally at 10, for providing EMI/RFI shielding. The gasket 10 is a multi-layered gasket shaped according to a predetermined pattern. The gasket 10 comprises a first layer 12 of electrically conductive resilient material and a second, support layer 14 of electrically conductive material secured in facing engagement to the first layer 12.

The first layer 12 is a generally flexible, resilient material which can be cut, stamped or otherwise formed into a thin-walled gasket and is electrically conductive, so that is provides EMI/RFI shielding of electronic components. It is also advantageous if the first layer 12 is able to resist contaminating fluids and is compressible, so that the first layer 12 can fill irregular surfaces and provides a good environmental seal.

In the presently preferred embodiment, the first layer 12 comprises an electrically conductive, expanded polytetrafluoroethylene (EPTFE). EPTFE is described in U.S. Pat. No. 3,953,566, which is incorporated herein by reference. The EPTFE has been made electrically conductive by filling the EPTFE with highly conductive carbon particles. Electrically conductive EPTFE, which is commercially available from W. L. Gore & Associates, Inc. of Elkton, Md., has a number of properties which make it an excellent gasket material, such as being lightweight, silicone free, corrosion resistant, easy to compress, resistant to contaminating fluids, and it does not break down over a wide temperature range (−200° C. to +200° C.). Accordingly, conductive EPTFE provides EMI/RFI shielding, while also providing an excellent environmental seal. Although the presently preferred embodiment of the first layer 12 comprises electrically conductive EPTFE, it will be apparent to those of ordinary skill in the art that other resilient materials that are electrically conductive are also suitable for constructing the first layer 12, such as a conductive plastic, conductive thermoplastic, or a conductive resin.

The second layer 14 is an electrically conductive material which is less flexible than the first layer 12 for imparting limited stiffness to the first layer 12. The second layer 14 is permanently attached or formed on an outer surface of the first layer 12 of the gasket 10 via adhesive or other bonding means. Any conductive material that will impart at least some rigidity to the first layer 12, yet is generally malleable is suitable for the second layer 14. An important feature of the second layer 14 is the strength of the material relating to the amount of stiffness or rigidity that the material imparts to the first layer 12. In the preferred embodiment, the second layer 14 comprises a conductive material which has a sufficiently high tensile strength to impart rigidity to the gasket 10 so that the first, resilient material layer 12 is not flimsy. This allows for easier handling and installation of the gasket 10. However, the second layer 14 should maintain the ability to be malleable, so that the gasket 10 or portions thereof can be bent, folded, notched, or otherwise formed, yet avoid significant changes in the conductive properties of the layers 12, 14.

Figure 8A:
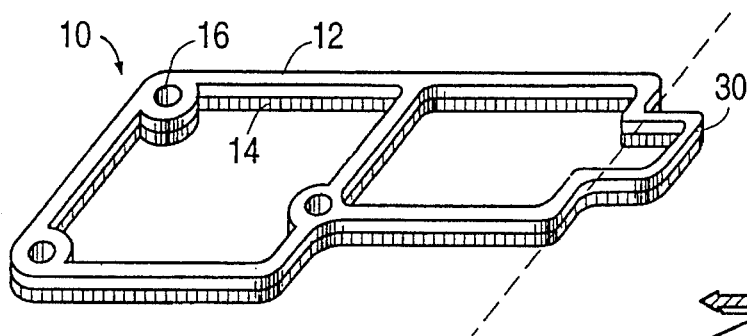
FIG. 8A is a perspective view of an EMI gasket in accordance with the present invention including a cut across a support layer of the gasket along a cut line to facilitate bending the gasket along the cut line.
Figure 8B:
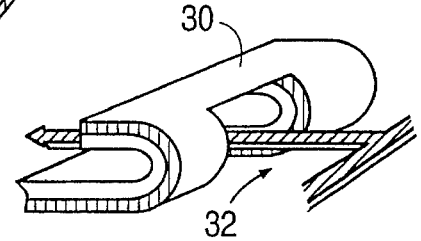
FIG. 8B is an enlarged, partial perspective view of the EMI gasket of FIG. 8A including a bend to avoid contacting and "shorting" a "hot" circuit board trace.
Figure 15:
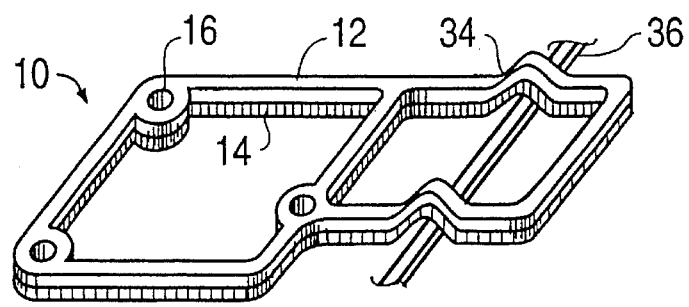
FIG. 15 is a perspective view of an EMI gasket in accordance with the present invention having a transverse notch therein.

As is shown in FIGS. 8A and 8B, the second layer 14 imparts significant rigidity to the first layer 12, but allows the gasket 10 to be bent and formed, such that the gasket 10 holds and maintains bends, as desired. In FIGS. 8A and 8B, the predetermined pattern of the gasket 10 includes a U-shaped outer leg 30. The U-shaped outer leg 30 may be bent and folded (FIG. 8B) such that it forms a relief to avoid short-circuiting a trace 32 in a circuit board. In order to facilitate bending the second layer 14 of the gasket 10, the second layer 14 could be cut or perforated, such as along the dashed line (FIG. 8A). Due to the conformable nature of the gasket 10, the gasket 10 can further be bent or formed to include a transverse notch 34 (FIG. 15) for allowing a circuit board trace 36 to pass there beneath without contacting the second layer 14 of the gasket 10. Although the notch 34 shown in FIG. 15 is V-shaped, it will be apparent to those of ordinary skill in the art that the notch 34 could be of various shapes and sizes and located across the gasket 10 at different angles or portions. The notch 34 is formed in the second layer 14 and may be formed during the manufacturing process or on-site, during installation, as required.

The second layer 14, in addition to imparting stiffness to the first layer 12, functions in combination with the first layer 12 to confine radiated energy to the bounds of a specific volume, or prevent radiated energy from reaching a specific volume. The Federal Communications Commission (FCC) has set limits as to how much energy is permitted to be radiated from electrical appliances, such as computers. The choice of the materials for the second, support layer 14 are very important. Thus, some of the considerations used in selecting the materials of the second, support layer 14 are the amount of reflective loss desired for electric fields, electrochemical corrosion resistance, mechanical strength, and electrical conductivity. The second, support layer 14 is thus a malleable conductive material, more desirably, a conductive metal. The second, support layer 14 can be constructed of either a single metal, a metal alloy, a metal or metal alloy mesh, a conductive polymer mesh or other nonmetal conductive material which imparts stiffness to the first layer 12. Generally, conductive metals which are also used for EMI shielding may be used, such as a conductive metal selected from the group consisting of, but not limited to, copper, nickel, silver, gold, aluminum, tin, zinc, or alloys thereof. Moreover, these materials are sufficiently malleable to allow the gasket 10 to be bent, folded or otherwise distorted without losing its stiffening properties. Although all of the aforementioned materials, and many other different materials are suitable and have been used to conduct electrical currents, it has been found that a copper foil layer meets the criteria of being highly conductive, generally malleable, and yet imparts significantly increased stiffness to the first, resilient material layer 12. However, it will be understood by those of ordinary skill in the art from this disclosure that other conductive materials could be used, and that the present invention is not limited to those specific conductive materials listed herein.

The metal, metal foil, or metal alloy may also be plated (e.g. tinned copper) to inhibit corrosion and prevent oxidation so that the gasket 10 can withstand harsh environments and provide a good environmental seal for a long period of time. It will be understood by those of ordinary skill in the art from this disclosure that many materials or metals could be used to plate the second, support layer 14 to prevent oxidation, such as silver and tin, and that the present invention is not limited to plating the second layer 14 with any particular metal.

The first and second layers 12/14 may be secured together in a variety of manners. If the first and second layers 12/14 are supplied in sheet, roll or strip form, the layers 12/14 could be bonded or laminated together prior to being cut or formed into their final shapes. Alternatively, the second layer 14 could compose a metal coating or plating which is applied to the first layer 12, or the second layer 14 could comprise a conductive mesh embedded or weaved into the first layer 12. Other possible suitable methods of positioning the second, support layer 14 over the resilient layer 18 may also be used, such as welding. Complete details of the particular manner in which the two layers 12/14 are secured together is not required for a complete understanding of the present invention. Accordingly, it will be apparent to those of ordinary skill in the art that other manners of securing the first and second conductive layers 12/14 together are within the scope and spirit of the present invention.

Presently preferred embodiments of the gasket 10 have a thickness in the range of 0.003 inches to 0.125 inches. Since the primary purpose of the second layer 14 is to impart stiffness to the first layer 12, the second layer need not be as thick as the first layer 12. Generally, in the illustrated embodiments, the second, support layer 14 is on the order of 20 percent of the thickness of the resilient material layer 12. This permits the second layer 14 to be strong enough and thick enough to remain joined to the first layer 12 over long periods of time, in harsh environments, such as varying temperatures, and despite varying and repeated compressive forces. Thus, for a gasket 10 which is 0.025 inches thick, it is presently preferred that the first layer 12 be about 0.020 inches thick and the second layer 14 being about 0.005 inches thick. Of course, it will be understood by those of ordinary skill in the art that gaskets of other thicknesses may also be made. For instance, metal foils which can be used for the second layer 14 currently range in thickness from 0.005 to 0.020 inches. It is contemplated that this range may encompass a broad range of about 0.001 to 0.060 inches for some applications.

The gasket 10 further comprises a means for fastening the gasket 10 to a substrate. FIG. 1 shows a plurality of through holes 16 located in spaced relation along the gasket 10. The holes 16 are sized to receive fasteners (not shown) for securing a cover over the gasket 100. Suitable fasteners for securing the cover and gasket 10 to a substrate are bolts, rivets, screws, clips, or the like. The gasket 10 may also be secured between two substrates with bolts securing the substrates together and extending through the holes 16. In addition to fastening the gasket 10 using fasteners in conjunction with the through holes 16, adhesives can be used to secure the gasket 10 to a substrate. Accordingly, the first layer 12 may also include an integral conductive pressure sensitive adhesive or adhesive backing for securing the gasket 10 to a substrate. Such adhesives for applying gaskets are known and a complete description of the composition and characteristics of the adhesive are not necessary for a complete understanding of the present invention.

A gasket 10 formed in accordance with the present invention is significantly stiffer than gaskets formed without the second layer 14. One of the advantages of providing a gasket with enhanced stiffness is that the gasket can be formed into many more shapes and sizes and can hold its shape. Referring now to FIG. 2, a gasket 10 in accordance with the present invention is shown wherein each of the first and second layers 12/14 further includes a discontinuous leg 18 which includes a through hole 16. The discontinuous leg 18 extends inwardly from the gasket 10 perimeter and is not connected at its distal end to any other portions of the gasket 10. Heretofore, gaskets with such discontinuous legs, such as leg 18 were hard to install and were susceptible to damage. However, by stiffening the first layer 12, the gasket 10 with such a discontinuous leg 18 is easy to install and handle.

Referring now to FIG. 4, another advantage of the second layer 14 is that the gasket 10 can include a tab 20 extending outwardly therefrom. The tab 20 is an integral part of the second layer 14 and is not in facing engagement with any portion of the first layer 12. The tab 20 may be bent or folded overtop a portion of the substrate 22 with which the gasket 10 is employed and used in conjunction with through holes 16 and fasteners, and/or adhesives to secure the gasket 10 to a substrate 22, as shown in FIG. 5. Alternatively, the tab 20 can be folded in an opposite direction around a lower substrate 24, in phantom. Due to the conformable material property of the second layer 14, the tab 20 maintains the form it is placed in (i.e. bent). FIG. 6 shows the tab 20 bent over the first layer 12 and positioned between the first layer 12 and a portion of the substrate 22. In this position, the tab 20 provides a low resistance electrical connection between the engaged portion of the upper substrate 22 and the lower substrate 24. If the second layer 14 is formed of a conductive metal, as previously discussed, the tab 20 provides a metal to metal connection between the upper and lower substrates 22/24, and thus can be used as a direct ground strap connection.

Figure 7B:
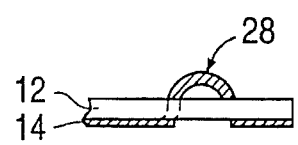
FIG. 7B is partial front elevational view of the EMI gasket of FIG. 7A.

Referring to FIGS. 7A and 7B, the gasket 10 can also be formed such that the first layer 12 includes a through hole 26 in a leg of the gasket 10 and the second layer 14 includes a tab 28 which projects through the through hole 26 to provide a metal to metal contact between the second layer 14 and a component or trace in contact with the tab 28. The tab 28 can be die cut in the second layer 14 during manufacture of the gasket 10.

Figure 9:
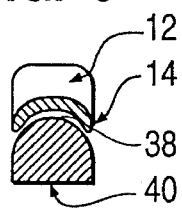
FIG. 9 is an enlarged, cross-sectional view of the EMI gasket of FIG. 1 taken along line 9—9.

FIG. 9 shows a cross-sectional view of the gasket 10 of FIG. 1 taken along line 9—9. The gasket 10 can be formed to have an arcuate outer surface 38 in the second layer 14 in order to mate with a curved or radiused substrate 40. The second layer 14 can be dimpled after the gasket 10 is formed to provide the arcuate surface 38. However, it will be apparent to those of ordinary skill in the art that the outer surface of the second layer 14 need not be dimpled or arcuate, as shown, but could be flat or planar, or curved outwardly, as desired, depending upon the nature of the surface of the substrate to be engaged.

Referring now to FIG. 11, the gasket 10 having first and second layers 12/14 is generally rectangular shaped and includes a tab along one side having a through hole 16. The through hole 16 can be used, as previously discussed, for securing the gasket 10 to a substrate. The first and second layers 12/14 of the gasket 10 have a plurality of corners, indicated at 42, which are bent and folded over such that the corners 42 extend at an angle of 45 degrees or greater from the first and second layers 12/14 for acting as a planar shield and provide a clearance over the first and second layers 12/14 equal to a thickness of the gasket 10. In this manner, the gasket 10 can also provide spacing or shock absorbing capabilities. For instance, the gasket 10 could be placed between two substrates 22/24, as shown in FIG. 12. The upper substrate 22 has one or more electrical components 44 on the surface facing the gasket 10. Accordingly, the folded corners 42 provide spacing, cushioning or shock absorbing capabilities between the two substrate 22/24 to protect components 44. It will be apparent to those of ordinary skill in the art that the gasket 10 need not be rectangular, but may be formed or cut into any geometric shape desired, having more or less than four corners. Additionally, all of the corners of the gasket 10 need not be bent or folded over.

Referring now to FIG. 13, yet another variation of the gasket 10 is shown. In FIG. 13, the second, support layer 14 includes one or more slots or holes 46 in a leg of the second layer 14 for allowing the first, resilient layer 12 to protrude therethrough. Since the first layer 12 is formed of resilient material and is much thicker than the second layer 14, as previously described, the first layer 12 adjacent to the hole 46 protrudes through the hole 46 and may contact a substrate (not shown). The first layer 12 can include an adhesive so that the portion of the first layer 12 which protrudes through the hole 46 adheres to the substrate.

It will be apparent to those of ordinary skill in the art that the hole 46 may vary in size and shape and may be positioned at any location(s) desired in the second layer 14.

Referring now to FIG. 14, the first, resilient layer 12 of the gasket 10 is secured in facing engagement with a second, conductive mesh layer 48. The mesh layer 48 may be constructed of either a single metal, a metal alloy, or a conductive polymer. Although constructed as a mesh, the second layer 48 still imparts a significant amount of stiffness to the first, resilient layer 12. A portion of the surface of the first layer 12 which is in facing engagement with the mesh layer 48 seeps or protrudes through the mesh layer 48. Thus, if the gasket 10 is applied or placed on a substrate, a portion of the first layer 12 protrudes through the mesh layer 48 and contacts the substrate. An adhesive applied or coated on the surface of the first layer 12 which is in facing engagement with the mesh layer 48 thus, also extends through the mesh layer 48 and contacts with the substrate, thereby securing the gasket 10 to the substrate.

Referring now to FIG. 3, the gasket 10 of the present invention further comprises a third layer 50 of electrically conductive, resilient material secured in facing engagement to the second, support layer 14 such that the second layer 14 is positioned between the first and third layers 12/50. The third layer 50 is preferably constructed of the same material as the first layer 12, which is carbon particle filled EPTFE. Since the first and third layers 12/50 are constructed of a resilient material, the gasket 10 can fully conform to an irregular surface located on either side of the gasket 10 because both sides are constructed of a very conformable material.

Figure 10:
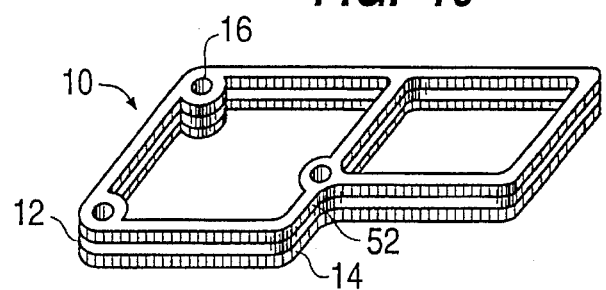
FIG. 10 is a perspective view of a second alternate embodiment of an EMI gasket in accordance with the present invention.

Alternatively, as shown in FIG. 10, the gasket 10 further comprises a third layer 52 of electrically conductive material secured in facing engagement with the first, resilient material layer 12, such that the first, resilient material layer 12 is positioned between the second and third layers 14/52. Preferably, the third layer 52 is constructed of the same materials and in the same manner as the second layer 14. This construction of the gasket 10 is useful for providing a full metal to metal contact between substrates located on and in contact with the second and third layers 14/52, respectively.

Thus, as is apparent from the foregoing description and the drawings, the gasket 10, such as shown in FIGS. 1, 2 and 4 may be punched, die-cut or otherwise shaped to various predetermined forms. Due to the stiffness imparted to the resilient material first layer 12 by the second, support layer 14, gaskets 10 having very narrow traces (legs), discontinuous legs, grounding tabs or fingers, and kinked or relieved areas can be formed which are easy to handle and install. Further, corners or tabs may be bent and folded to permit the gasket 10 to be used as a compression stop/shock absorber as well as a shield.

Figure 16:
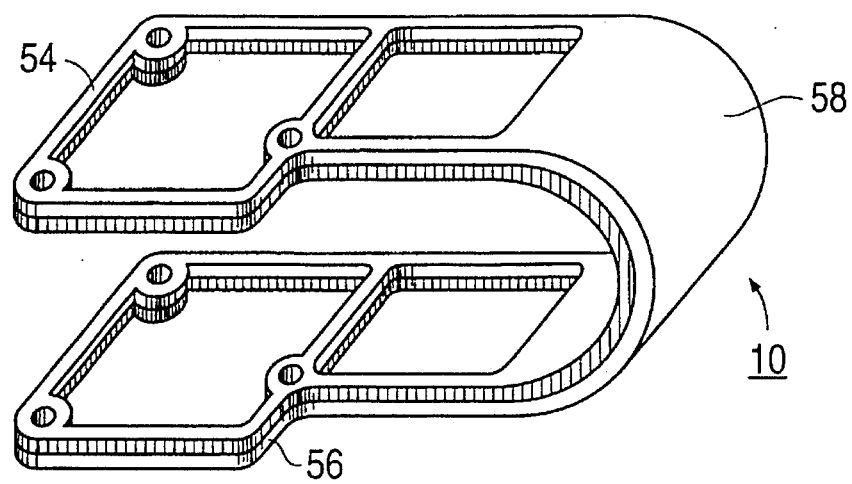
FIG. 16 is a perspective view of an EMI gasket in accordance with the present invention being a multiple layered structure that can be folded around a circuit board.

Still another embodiment of a gasket 10 of the present invention is shown in FIG. 16. In this instance, the gasket 10 comprises a multiple layered structure having two or more EMI patterns 54, 56 suitable for attachment to both top and bottom sides of a circuit board. The gasket 10 may then be folded over itself around a circuit board along connected edge 58, in the manner shown, to instantly provide EMI shielding properties to both sides of the board. It should be evident that the patterns of 54, 56 may be identical, as shown, or may differ from one another to address the structures of each side of the board. It should be further evident that still more layers of EMI patterns may be provided in this manner to address situations where multiple layered circuit boards may need to be shielded.

Figure 17:
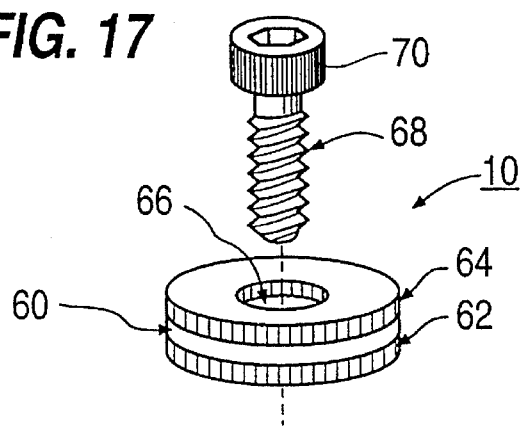
FIG. 17 is a perspective view of an EMI gasket in accordance with the present invention being essentially a washer.

Yet another embodiment of a gasket 10 of the present invention is shown in FIG. 17. In this instance, the gasket 10 comprises a circular washer element having a resilient center layer 60 and metal foil layers 62, 64 on its top and bottom surfaces. A center opening 66 is provided to receive a bolt 68 or similar element. This construction is particularly suitable for eliminating leakage or susceptibility around bolt heads 70 and similar applications.

From the foregoing description, it can be seen that the preferred embodiment of the invention comprises a gasket 10 for use in transmitting electrical current. The gasket 10 exhibits excellent EMI/RFI characteristics. Further, the gasket 10 can be easily and efficiently manufactured. Moreover, it is clear that gaskets 10 according to the present invention may be formed (cut, molded, extruded, etc.) into a variety of shapes and forms and accordingly, the present invention should not be limited to any particular shape.

It should be understood that in each of the embodiments of the present invention, the rigid conductive layer, whether metal foil or other construction, may comprise single or multiple laminates of conductive material.

It will be appreciated that changes and modifications may be made to the above described embodiments without departing from the inventive concept thereof. Therefore, it is understood that the present invention is not limited to the particular embodiment disclosed, but is intended to include all modifications and changes which are within the scope and spirit of the invention as defined by the appended claims.

What is claimed is:

1. A multi-layered gasket for shielding electrical components from electromagnetic interference comprising:

a first flexible layer of electrically conductive resilient material;

a second, electrically conductive support layer secured to the first layer in facing engagement, the support layer being less flexible than the first layer so as to impart stiffness to the first layer; and wherein the second layer is approximately one-fifth as thick as the first layer.

2. The gasket of claim 1 wherein the first layer comprises carbon particle filled EPTFE.

3. The gasket of claim 1 wherein the material of the support layer is selected from the group consisting of copper, aluminum, nickel, gold, silver, tin and alloys thereof.

4. The gasket of claim 1 wherein the first layer comprises a conformable, conductive material.

5. The gasket of claim 4 wherein the conformable conductive material comprises a carbon particle filled EPTFE and the second, support layer comprises a metal foil.

6. The gasket of claim 1 wherein each of the first and second layers further comprise a discontinuous leg.

7. The gasket of claim 1 wherein the support layer includes a tab extending outwardly therefrom, wherein the tab is formable for securing the gasket to a substrate.

8. The gasket of claim 1 wherein the first layer includes a through hole in a leg of the gasket and the second layer includes a tab which projects through the through hole.

9. The gasket of claim 1 wherein the gasket includes a transverse notch for allowing a circuit board trace to pass therebeneath without contacting the gasket.

10. The gasket of claim 1 wherein the support layer includes an arcuate cross-section for mating to a substrate having a complementary arcuate cross-section.

11. The gasket of claim 1 wherein the first and second layers have a plurality of corners, at least one of the corners being bent such that the corner extends at an angle of 45 degrees or greater from the first and second layers for acting as a planar shield to provide a clearance over the first and second layers equal to a thickness of the gasket for also providing shock absorbing capabilities.

12. The gasket of claim 1 wherein the support layer includes one or more holes for allowing the first, resilient layer to protrude through the hole.

13. The gasket of claim 1 wherein the support layer is comprised of a mesh layer and a portion of the first, resilient material layer extends through the mesh.

14. The gasket of claim 13 wherein the mesh layer comprises a conductive polymer.

15. The gasket of claim 13 further comprising an adhesive positioned between the support layer and the first, resilient material layer, at least a portion of the adhesive extending into the mesh.

16. The gasket of claim 1 further comprising a means for fastening the gasket to a substrate.

17. The gasket of claim 15 wherein the first and second layers include a plurality of through holes for receiving a fastener, the fastener securing the gasket to a substrate.

18. The gasket of claim 1 further comprising a third layer of electrically conductive resilient material secured in facing engagement with the support layer, such that the support layer is positioned between the first and third layers.

19. The gasket of claim 1 further comprising a third layer of electrically conductive material secured in facing engagement with the first, resilient material layer, such that the first, resilient material layer is positioned between the second and third layers.

20. The gasket of claim 1 wherein the gasket comprises a multiple layered structure having multiple EMI patterns for attachment around a component to provide shielding to multiple surfaces.

21. A multi-layered gasket for shielding electrical components from electromagnetic interference comprising:

a first flexible layer of electrically conductive resilient material;

a second, electrically conductive support layer secured to the first layer in facing engagement, the support layer being less flexible than the first layer so as to impart stiffness to the first layer; and wherein the first and second layers have a plurality of corners, at least one of the corners being bent such that the corner extends at an angle of 45 degrees or greater from the first and second layers for acting as a planar shield to provide a clearance over the first and second layers equal to a thickness of the gasket for also providing shock absorbing capabilities.

22. A multi-layered gasket for shielding electrical components from electromagnetic interference comprising:

a first flexible layer of electrically conductive resilient material;

a second, electrically conductive support layer secured to the first layer in facing engagement, the support layer being less flexible than the first layer so as to impart stiffness to the first layer; and wherein the gasket includes a transverse notch for allowing a circuit board trace to pass therebeneath without contacting the gasket.

23. A multi-layered gasket for shielding electrical components from electromagnetic interference comprising:

a first flexible layer of electrically conductive resilient material;

a second, electrically conductive support layer secured to the first layer in facing engagement, the support layer being less flexible than the first layer so as to impart stiffness to the first layer; and wherein the support layer includes an arcuate cross-section for mating to a substrate having a complementary arcuate cross-section.

24. A multi-layered gasket for shielding electrical components from electromagnetic interference comprising:

a first flexible layer of electrically conductive resilient material;

a second, electrically conductive support layer secured to the first layer in facing engagement, the support layer being less flexible than the first layer so as to impart stiffness to the first layer; and wherein the gasket comprises a multiple layered structure having multiple EMI patterns for attachment around a component to provide shielding to multiple surfaces.

* * * * *